United States Patent [19]
Rohr

[11] 4,142,144
[45] Feb. 27, 1979

[54] POSITION DETECTOR

[75] Inventor: Bruce E. Rohr, Brookline, Mass.

[73] Assignee: General Scanning, Inc., Watertown, Mass.

[21] Appl. No.: 849,018

[22] Filed: Nov. 7, 1977

[51] Int. Cl.² ............................................. G01R 27/26
[52] U.S. Cl. ................................ 324/61 R; 318/65 D; 318/662; 324/60 CD
[58] Field of Search ................. 324/61 R, 61 P, 60 R, 324/60 CD, 157; 318/650, 662

[56] References Cited

U.S. PATENT DOCUMENTS

| Re. 27,829 | 12/1973 | Tiffany | 324/60 CD |
|---|---|---|---|
| 3,226,979 | 1/1966 | DeBoice | 324/61 R X |
| 3,242,399 | 3/1966 | Frisch | 324/60 R X |

*Primary Examiner*—Stanley T. Krawczewicz

[57] ABSTRACT

A transformerless capacitance detection device for picofarad level capacitances, used in a galvanometer for position feedback. A variable capacitor is connected between transistor emitter and ground with a ground-referenced oscillating voltage source connected directly to base and a capacitor discharge means connected to the emitter. Oscillating voltage appears across the capacitor via the transistor base; the capacitor is charged through the transistor while the transistor is conducting and is discharged through the discharge means while the transistor is non-conducting. The collector current while conducting is a measure of capacitance in this transformerless, simple circuit. This current is used to feedback the position of the rotor of a galvanometer or other moving element to enable operation of the position control circuit for the element. Preferred embodiments use differential capacitors sensing rotational position of the galvanometer, two transistors with each capacitor connected between an emitter and ground, with bases connected to common sinusoidal voltage, and diodes connected between emitters and bases as the discharge means; the difference between collector currents represents galvanometer position.

9 Claims, 6 Drawing Figures

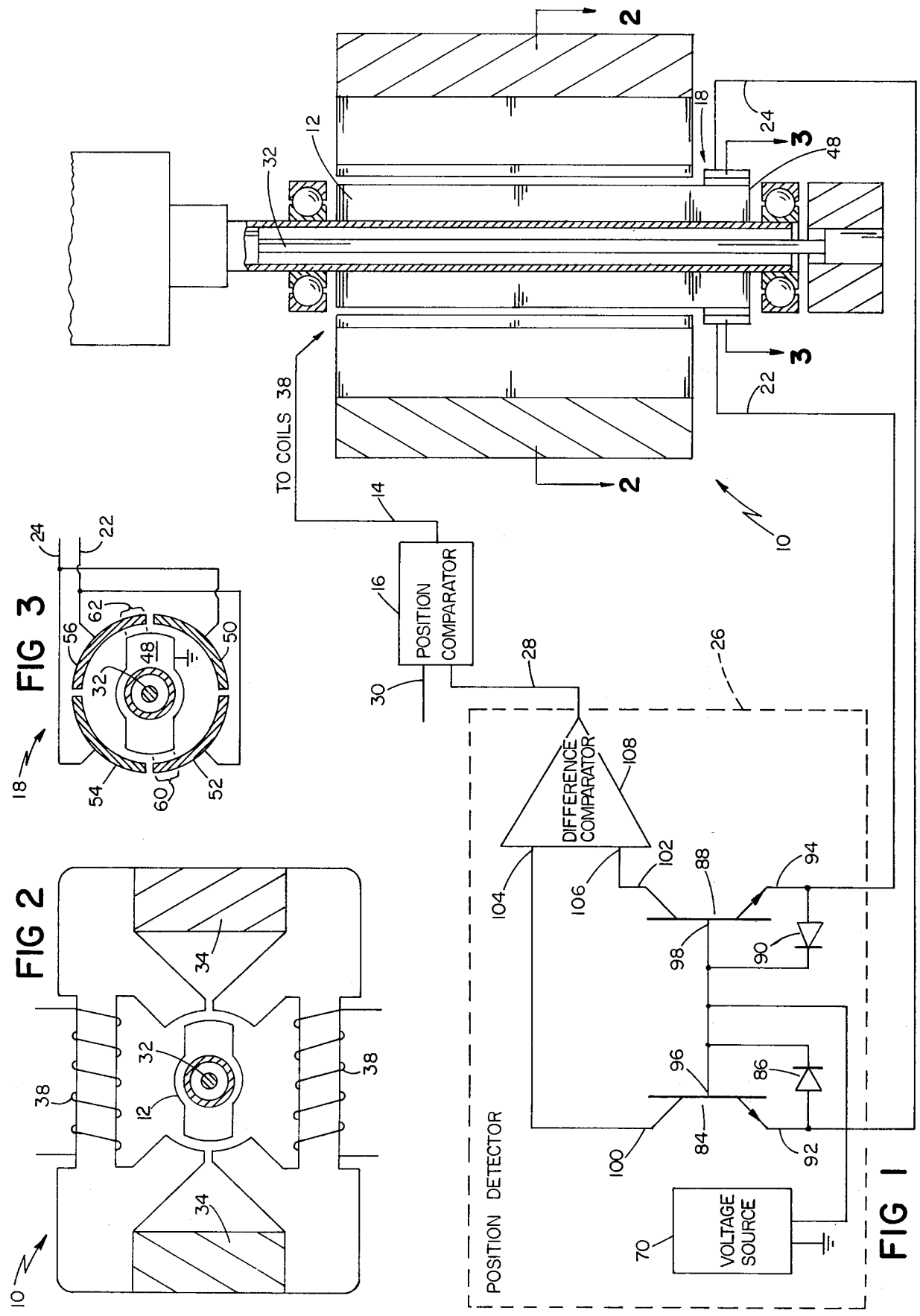

POSITION DETECTOR

BACKGROUND OF THE INVENTION

In the field of galvanometers there is a stringent requirement in many applications for accurate detection of the position of the moving element, without temperature drift and the like. This position information is fed back to the control circuitry for increasing the accuracy of control. There is also a need for providing such accurate detection at low cost, in a small physical volume, and in a manner requiring only low voltages. Because these requirements have not been fully met, undesirable compromises have been required.

For example, accurate detection has been achieved employing variable inductance transducers, but these are expensive, difficult to manufacture, and large physically because of the inductor elements. Accurate detection has also been achieved employing variable capacitance detectors, but with many of the same drawbacks. The present invention concerns an improved variable capacitance detector.

A known detector of the variable capacitance type for detection accuracies here concerned ("picofarad" capacitances: i.e. capacitances less than 1 and up to 10 pf capacitance) is described in the various Abbe patents (U.S. Pat. Nos., 3,694,741; 3,706,919; 3,771,051; 3,775,678; 3,775,679; 3,805,150; and 3,812,424) to which reference is made. The key to successful operation of the Abbe circuit, the use of transformers, also leads to the cost and size drawbacks inherent in such transformers. Commercial forms of this circuit have other drawbacks such as a relatively large number of components and complexity of the circuit, which add to cost and make trouble-shooting in the manufacturing process difficult. Such differential capacitance circuits have been commercially employed for detecting picofarad capacitance changes in high speed optical scanning applications, but with the drawbacks noted. Furthermore such circuits have not been used in other applications as in pen driving motors for high performance medical strip chart recorders, where cost has been an even more important criterion, and the high voltage associated with the transformer a distinct danger.

Another detector of the variable capacitance type has been used for many years in certain kinds of strip chart recorders. It employs the combination of a common base transistor circuit with a transformer. The transformer, located in the emitter leg, imposes a floating sinusoidal voltage from an oscillator upon a variable capacitor which has one plate connected via the transformer to the emitter, and the other plate connected to ground. The common base amplifier is used to enable a low voltage to be employed across the capacitor by one terminal, the emitter. The other terminal, the collector, demonstrates a high impedance. In one excursion of the sinusoid, the capacitor is charged by current from the collector, and hence the collector current is a measure of the capacitance of the variable capacitor. In the opposite excursion the capacitor is discharged via a diode to the base of the transistor.

The transformer as well as the large capacitor of this system have lead to expense, bulk and frequency-limiting inertia. Furthermore the sensitivity of this circuit is limited in that it requires a relatively high value of capacitance, e.g., 50 to 100 pf, in order to avoid detrimental temperature drift.

A prior attempt to provide a transformerless circuit for variable capacitance detection is that shown in Lion U.S. Pat. No. 3,012,192. But because the signal it produces is dependent upon a ratio involving the sum of two capacitances in the differential capacitance circuit, the circuit demontrates an inherently large common mode thermal instability. This renders it unsuitable for picofarad detection for which the present invention is intended.

SUMMARY OF THE INVENTION

The object of the invention is to resolve the difficulties which have confronted the industry, thus to enable improved galvanometer systems to be made. The invention aims to provide picofarad galvanometer position detection operation, which is simple and inexpensive to manufacture, safe to use, and of extreme compactness.

Another object is to provide, in more general terms, an improved picofarad position detection system for mechanical elements of the variable capacitance type.

According to the invention, a transformerless capacitance detection circuit is realized employing an emitter-follower transistor amplifier in which a ground-referenced oscillator applies its wave form to the base of the transistor cicuit, and via the transistor junction, to the emitter. The variable capacitor is located in the emitter leg, with one plate connected to ground. During one side of the voltage excursion applied to the transistor base, the collector current charges the capacitor. The collector current is then dependent upon the capacitance of the capacitor, as is the case in the prior art strip chart recorder circuit mentioned above, but with extremely important differences. Lacking the transformer, and the inherent capacitance between primary and secondary, a serious source of temperature drift is avoided, allowing the present circuit to operate in the picofarad range. Equally, the circuit of the invention avoids the other drawbacks of the prior art transformer circuit, namely relatively high cost, large size and high inertia, and difficulty of manufacture.

The resulting circuit, particularly in its preferred, differential capacitance-measuring form with common noise mode rejection, provides a galvanometer position detention circuit capable of responding to capacitance changes of the order of 1 and less pf over the full range of mechanical excursion.

PREFERRED EMBODIMENT

The preferred embodiment of the invention will now be described, in connection with the drawings wherein:

FIG. 1 is a longitudinal cross-section view of a galvanometer, with its position detection and control circuits shown diagrammatically;

FIGS. 2 and 3 are transverse cross-sectional views taken on lines 2—2 and 3—3 of FIG. 1;

FIG. 4 is a diagram of the basic capacitance detection circuit while

FIGS. 1-3 show a circuit for the detection and control of the rotational position of a galvanometer.

Figure 4:
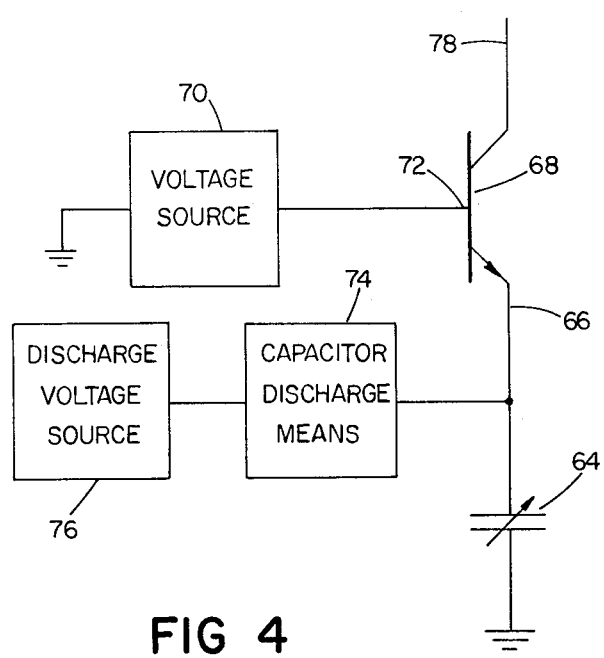

As shown in FIGS. 1 and 2 galvanometer 10 has a rotor 12 which is mounted on shaft 32 which is free to rotate. The rotational position of rotor 12, and thereby of shaft 32, is determined by the current supplied to coils 38 of galvanometer 10 by output 14 of position comparator 16. As shown in FIGS. 1 and 3 position sensor 18 contains a rotor section 48 which is also mounted on shaft 32 and which rotates as rotor 12 rotates. Sensor 18 is a differential capacitance sensor in which the capacitances appearing at outputs 22 and 24 of sensor 18 are dependent upon the rotational position of rotor 48 and thereby upon the position of rotor 12. Position detector 26 is a differential capacitance detection circuit which detects the capacitances appearing at outputs 22 and 24 and generates output 28 which indicates the rotational position of rotors 48 and 12. Signal 30 represents the desired rotational position of rotor 12 and position comparator 16 compares signal 30 to output 28 to detect any difference between the actual and desired positions of rotor 12. Comparator 16 then generates output 14 to cause rotor 12 to assume the position indicated by signal 30.

Referring further to FIGS. 1 and 2, rotor 12, which is mounted on shaft 32, is made of magnetic material. Permanent magnets 34 exert a rotational force on rotor 12 to cause it to assume the position shown. Current flowing in coils 38 will generate a magnetic field which will cause rotor 12 to rotate away from the position shown. Rotor 12 will rotate to a position where the forces exerted by coils 38 and magnets 34 are balanced and, as the force exerted by magnets 34 is fixed, the position of rotor 12 will thereby be dependent upon the current flowing in coils 38.

Further details of the construction and operation of such galvanometers may be found in Montagu, U.S. Pat. No. 3,624,574, and Bronsens, U.S. Pat. No. 3,753,106, which are incorporated herein by reference.

Referring to FIGS. 1 and 3, sensor 18 is comprised of rotator 48 and stators 50, 52, 54 and 56. Stators 52 and 56 are connected together to form one plate of the capacitor appearing at output 22 and stators 50 and 54 are connected together to form one plate of the capacitor appearing at output 24. Rotor 48 forms the other plate of both capacitors and is connected to ground. The capacitance of both capacitors is dependent upon the areas of the stators occluded by rotor 48, as in areas 60 and 62 of stators 52 and 56. The capacitances appearing at outputs 22 and 24 will be equal when rotor 48 is in the position shown and one capacitance will increase and the other decrease as shaft 32 rotates rotor 48 in one direction while the reverse will happen for rotation in the other direction.

FIG. 4 shows the basic capacitance detection circuit preferred for use in position detector 26. This is an emitter-follower type circuit in which variable capacitor 64 is connected between emitter 66 of transistor 68 and ground. Voltage source 70 is a ground-referenced oscillator whose varying voltage output is connected to base 72 of transistor 68 while capacitor discharge means 74 is connected between emitter 66 and discharge voltage source 76. It is preferred that the output of voltage source 70 be a sinusoidally varying voltage having a frequency in the region of 1 MHz. The sinusoidal voltage imposed on base 72 appears on emitter 66 and thereby appears across capacitor 64. The sinusoidal voltage also drives transistor 68 alternately into the conducting and non-conducting states, depending upon whether the sinusoidal voltage imposed on base 72 is higher than or lower than the sinusoidal voltage appearing on emitter 66. When transistor 68 is non-conducting, current is discharged from capacitor 64 to source 76 through discharge means 74. The voltage appearing at emitter 66 will therefore follow the sinusoidal voltage imposed on base 72 during a downward swing and, so long as the current discharged from capacitor 64 through discharge means 74 is not so large as to draw the voltage at emitter 66 below that imposed on base 72, transistor 68 will remain non-conductive. On upward swings of the sinusoidal voltage, the voltage imposed on base 72 will go above that appearing at emitter 66 by an amount sufficient to drive transistor 68 into conduction and current will flow into capacitor 64 from collector 78 of transistor 68, charging capacitor 64. The current flowing in collector 78 during this half of the sinusoidal voltage cycle is dependent upon the capacitance of capacitor 64. This dependence is expressed by the equation $I \simeq 2.22CAf$, where C is the capacitance of capacitor 64, A is the amplitude of the sinusoidal voltage, and f is the frequency of the sinusoidal voltage. The current in collector 78 is thereby directly proportional to the capacitance of capacitor 64.

In an embodiment of the circuit of FIG. 4, capacitor discharge means 74 is a resistor and discharge voltage source 76 is a fixed voltage at or below ground potential.

Figure 5:
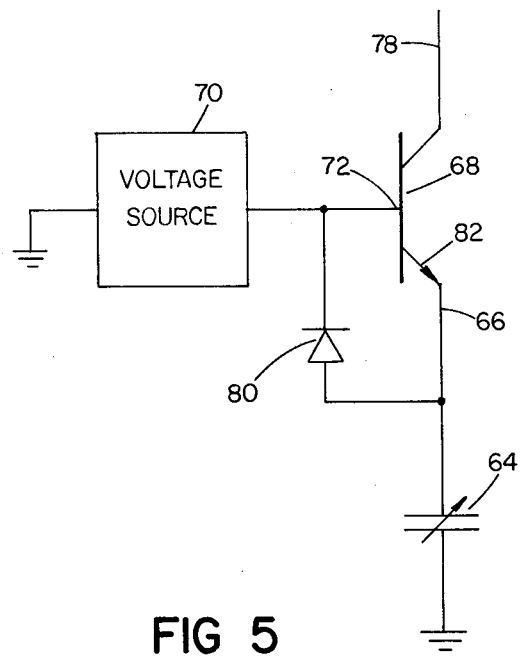
FIG. 5 shows the preferred details of the basic capacitance detection circuit.

In the preferred embodiment, as shown in FIG. 5, capacitor discharge means 74 and discharge voltage source 76 are implemented by diode 80 connected between emitter 66 and base 72 in the opposite direction to internal base emitter diode 82 of transistor 68. In this embodiment, capacitor 64 is discharged through diode 80 to sinusoidal voltage source 70 during the downward swings of the sinusoidal voltage when transistor 68 is in the non-conducting state. The voltage appearing on emitter 66 will follow the voltage imposed on base 72 without the need to carefully select the discharge current to avoid pulling down the emitter 66 voltage and driving transistor 68 into conductance.

As is well known, the circuit of FIG. 5, which is shown as using a transistor of the type referred to as an NPN transistor, can be equally implemented utilizing a transistor of the opposite voltage polarity, referred to as a PNP transistor.

Figure 6:
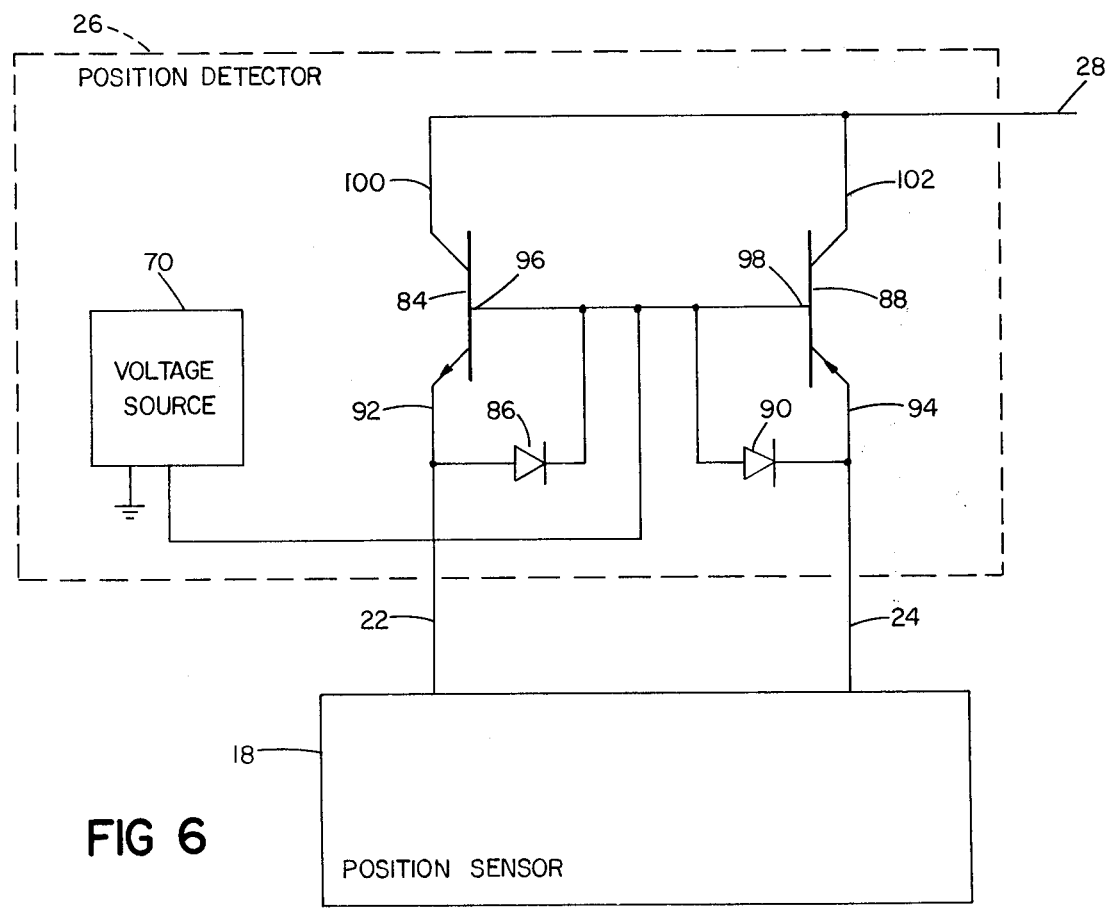
FIG. 6 shows an embodiment of a differential capacitance detection device useful in determining the rotational position of a galvanometer of other movable element.

FIG. 6 shows an embodiment of position detector 26 as a differential capacitance detection device utilizing position sensor 18 and the preferred embodiment of the capacitance detection circuit shown in FIG. 5. Transistor 84 and diode 86 form a capacitance detection circuit as shown in FIG. 5, in this case being of the NPN configuration, while transistor 88 and diode 90 form a capacitance detection circuit of the PNP configuration. Emitters 92 and 94 are connected, respectively, to outputs 22 and 24 of position sensor 18. Rotor 48 of position sensor 18 is connected to ground as previously discussed. Voltage source 70 drives bases 96 and 98. As transistors 84 and 88 are of opposite voltage polarity, transistor 84 will be conducting during upward swings of the sinusoidal voltage and non-conducting during downward swings of the sinusoidal voltage while the reverse will occur in the operation of transistor 88. The current flowing in collectors 100 and 102 will be dependent upon the capacitances of sensor 18. Collectors 100 and 102 are connected together and provide output 28 to position comparator 16, so that the currents flowing in collectors 100 and 102 comprise output 28. Because the detection device of FIG. 6 is a differential detection device, the current flowing in output 28 is represented by $I \simeq Af(C_2 - C_1)$, where A and f are as previously defined and $C_2$ and $C_1$ are, respectively, the capacitances of the capacitors of sensor 18. As these capacitances are dependent upon the rotational position of galvanometer 10, output 28 thereby represents the position of galvanometer 10.

Referring again to FIG. 1, the preferred embodiment of position detector 26 is a differential capacitance detection device utilizing, again, position sensor 18 and the preferred embodiment of the capacitance detection circuit shown in FIG. 5. Transistor 84 with diode 86 and transistor 88 with diode 90 form two capacitance detection circuits as shown in FIG. 5. In the preferred embodiment, transistors 84 and 88 are of the same voltage polarity, in this case being of the NPN configuration. Emitters 92 and 94 are connected to outputs 22 and 24, respectively, from position sensor 18 while rotor 48 of position sensor 18 is connected to ground as previously discussed. Voltage source 70 drives bases 96 and 98. As transistors 84 and 88 are of the same voltage polarity, both will be conducting or non-conducting at the same time. The currents flowing in collectors 100 and 102 will be dependent upon the capacitances of sensor 18. Collectors 100 and 102 are connected to inputs 104 and 106, respectively, of difference comparator 108. Comparator 108 compares the currents flowing in collectors 100 and 102 and generates output 28 to position comparator 16 where output 28 represents the difference between the currents in collectors 100 and 102. As the capacitances of sensor 18 are dependent upon the rotational position of galvanometer 10, output 28 will thereby represent this rotational position.

The embodiment of FIG. 1 has very good common mode noise rejection for noise appearing in the circuitry and, in particular, on outputs 22 and 24 of position sensor 18. Such noise at outputs 22 and 24, if of a lower frequency that that of the voltage generated by source 70, can make one capacitor of sensor 18 appear larger than the other and result in a galvanometer position error. The use of the circuit of FIG. 1 provides this common mode noise rejection.

It is preferred that transistor 84 and 88 be of the type referred to as RF transistors, for example, Motorola 2N5210, and diodes 86 and 90 be of a type similar to 1N4148.

In a particular example the galvanometer is adapted to drive a pen motor for strip chart recording at frequencies in the range of 150 Hz. In this embodiment rotor 12 is 1.75 inch long and 0.49 inch outer diameter, with rotor section 48 having an axial length of 0.375 inch and an outer diameter also of 0.49 inches. The total moment of inertia of rotors 12 and 48 is approximately 3 gm-cm. The voltage source 70 is a standard Colpitts oscillator with one terminal connected to ground and applying a maximum of 15 volts peak to peak across the capacitor. In this case the differential capacitance sensed over peak to peak mechanical excursion is 1.0 p.f.

In another embodiment, this galvanometer is adapted to drive a scanning mirror e.g., for laser radiation, at frequencies in the range of 1KHz. The higher driving frequency is allowed by the lower inertial loading presented by the mirror.

What is claimed is:

1. A transformerless capacitance detection device capable of detecting picofarad changes in capacitance comprising:
   a capacitor having a variable capacitance, and
   a capacitance detection means comprising,
      a transistor,
      a capacitor discharge means, and
      a ground-referenced oscillator generating a varying voltage,
   said capacitor being connected between the emitter of said transistor and ground,
   said capacitor discharge means being connected between said emitter and a voltage level,
   said varying voltage being from said oscillator being connected directly to the base of said transistor, and
   the collector of said transistor providing an output;
   said varying voltage driving said base of said transistor, thereby driving said transistor alternately into the conducting and non-conducting states, said capacitor being charged by the collector current of said transistor when said transistor is in the conducting state and being discharged through said discharge means when said transistor is in the non-conducting state,
   the current flowing in the collector of said transistor during said charging of said capacitor being dependent upon and thereby representing the present value of said capacitance.

2. In a galvanometer comprising a rotor and stator assembly that includes a driving coil for rotatably driving the rotor, a variable capacitance detection device capable of detecting the position of the rotor and a driving circuit responsive to drive signals and signals from said position detection device for altering the current through said drive coil thus to position said rotor, the improvement wherein said differential capacitance detection device is transformerless and capable of detecting picofarad changes in capacitance, said detection device comprising
   a first and a second variable capacitor, said capacitors mechanically coupled to said rotor so that said capacitance of said first capacitor increases or decreases as said capacitance of said second capacitor respectively decreases or increases, and
   a capacitance detection means comprising
      a first and a second transistor,
      a first and a second capacitor discharge means, and
      a ground-referenced oscillator generating a periodically varying voltage,
      said first capacitor being connected between the emitter of said first transistor and ground and said second capacitor being connected between the emitter of said second transistor and ground,
      said first capacitor discharge means being connected between said emitter of said first transistor and a first voltage level and said second capacitor discharge means being connected between said emitter of said second transistor and a second voltage level,
      said varying voltage being connected directly to the bases of said first and second transistors, and
      the collectors of said first and second transistors providing respectively first and second outputs,
   said varying voltage driving said bases of said first and second transistors, thereby driving each of said first and second trnsistors alternately into the conducting and non-conducting states, and
   said varying voltage thereby appearing across said first and second capacitors, said first and second capacitors being charged through said first and second transistors respectively when said transistors are in the conducting state and discharged through said first and second capacitor discharge means respectively when said transistors are in the non-conducting state, so that current flows in the colletors of said first and second transistors during the charging of said first and second capacitors respectively, said collector currents being dependent upon and thereby indicating the present values of said first and second capacitors, and means to provide a differential current representing the difference between said collector currents as the rotor position detection signal.

3. The galvanometer of claim 1 wherein:

said first and second transistors are of the same voltage polarity so that said first and second transitors are always in the same said state both being conducting or non-conducting at a given point in the cycle of the varying voltage, and an amplifier having said first and second outputs from said collectors of said first and second transistors as inputs, said amplifier comparing said first and second outputs and generating a third output dependent upon the difference in said first and second outputs thereby indicating the difference between said capacitances of said first and second capacitors.

4. The galvanometer of claim 1 wherein:

said first and second transistors are of the opposite voltage polarity so that said first and second transistors are always in the opposite said states, one said transistor being conducting and one said transistor being non-conducting at a given point in the cycle of said varying voltage, said collector of said first transistor connected to said collector of said second transistor, thereby providing a single output dependent upon and thereby indicating the difference between said capacitances of said first and second capacitors.

5. A transformerless differential capacitance device useful in determining the rotational position of a galvanometer comprising:

a first and a second variable capacitor, said capacitors comprising a rotor and four stators, said rotor rotating about its center and being coupled to a galvanometer so that the rotational position of said rotor is determined by the rotational position of said galvanometer, said stators being circumferentially located about said rotor in diametrically opposing pairs, and one said pair being connected together to comprise a first plate of said first capacitor, another said pair being connected together to comprise a first plate of said second capacitor and said rotor comprising a common second plate to both said first and second capacitors, the capacitance of said first and second capacitors being dependent upon the mutually occluded areas between said rotor and said stators comprising said first sides of said capacitors so that said capacitances are dependent upon said rotational position of said galvanometer, and said capacitances of said first and second capacitors respectively increasing and decreasing for one direction of rotation and the reverse occurring for the other direction of said rotation, said capacitors having maximum capacitances in the range of about 0.5pf to 10pf, and a capacitance detection means comprising a first and a second transistor, a first and a second capacitor discharge means, and a ground-referenced oscillator generating a varying voltage, said first capacitor being connected between the emitter of said first transistor and ground and said second capacitor being connected between the emitter of said second transistor and said ground, said first capacitor discharge means being connected between said emitter of said first transistor and a first voltage level and said second capacitor discharge means being connected between said emitter of said second transistor and a second voltage level, said varying voltage source being connected directly to the bases of said first and second transistors, and the collectors of said first and second transistors providing respectively first and second outputs;

said varying voltage source driving said bases of said first and second transistors, thereby driving said first and second transistors alternately into the conducting and non-conducting states and said varying voltage appearing across said first and second capacitors, said first and second capacitors being charged through said first and second transistors respectively when said transistors are in the conducting state and discharged through said first and second capacitor discharge means respectively when said transistors are in the non-conducting state, so that current flows in the collectors of said first and second transistors during the charging of said first and second capacitors respectively, said currents being dependent upon and thereby indicating the present values of said first and second capacitors.

6. A transformerless differential capacitance detection device useful in determining the rotational position of a galvanometer comprising:

a first and a second variable capacitor, said capacitors comprising:

a rotor and four stators, said rotor rotating about its center and being coupled to a galvanometer so that the rotational position of said rotor is determined by the rotational position of said galvanometer, said stators being circumferentially located about said rotor in diametrically opposing pairs, and one said pair being connected together to comprise a first plate of said first capacitor, another said pair being connected together to comprise a first plate of said second capacitor and said rotor comprising a common second plate to both said first and second capacitors, the capacitance of said first and second capacitors being dependent upon the mutually occluded areas between said rotor and said stators comprising said first plates of said capacitors so that said capacitances are dependent upon said rotational position of said galvanometer, and said capacitances of said first and second capacitors respectively increasing and decreasing for one direction of rotation, the reverse occurring for the other direction of said rotation, said capacitors having maximum capacitances in the range of about 0.5pf to 10pf, a capacitance detection means comprising a first transistor and a second transistor, said transistors being of the same voltage polarity, a first diode and a second diode, and a ground-referenced oscillator generating a varying voltage, said first diode being connected between the base and the emitter of said first transistor and said second diode being connected between the base and the emitter of said second transistor, said diodes being connected in the opposite direction to the internal base-emitter diodes of said transistors, said varying voltage source being connected to said bases, the ungrounded side of said first capacitor being connected to said emitter of said first transistor and the ungrounded side of said second capacitor being connected to said emitter of said second transistor, and the collectors of said first and second transistors providing respectively first and second outputs, said varying voltage source driving said bases of said first and second transistors, thereby driving said first and second transistors together into alternately conducting and non-conducting states, and said varying voltage appearing across said first and second capacitors, said first and second capacitors being charged through said first and second transistors respectively when said transistors are in the conducting state and discharged through said first and second capacitor discharge means respectively when said transistors are in the non-conducting state, so that current flows in the collectors of said first and second transistors during the charging of said first and second capacitors respectively, said current being dependent upon and thereby indicating the present values of said first and second capacitors, and an amplifier having said first and second outputs from said collectors of said first and second transistors as inputs, comparing said first and second outputs and generating a third output dependent upon the difference in said first and second outputs, thereby indicating the difference between said capacitances and said rotational position of said galvanometer.

7. A transformerless differential capacitance detection device capable of detecting picofarad changes in capacitance comprising:

a first and a second variable capacitor, said capacitors having maximum capacitances in the range of about 0.5pf to 10pf and mechanically coupled so that said capacitance of said first capacitor increases or decreases as said capacitance of said second capacitor respectively decreases or increases, and a capacitance detection means comprising a first and a second transistor, a first and a second capacitor discharge means, and a ground-referenced oscillator generating a periodically varying voltage, said first capacitor being connected between the emitter of said first transistor and ground and said second capacitor being connected between the emitter of said second transistor and ground, said first capacitor discharge means being connected between said emitter of said first transistor and a first voltage level and said second capacitor discharge means being connected between said emitter of said second transistor and a second voltage level, said varying voltage being connected directly to the bases of said first and second transistors, and the collectors of said first and second transistors providing respectively first and second outputs;

said varying voltage driving said bases of said first and second transistors, thereby driving said first and second transistors alternately into the conducting and non-conducting states, and said varying voltage appearing across said first and second capacitors, said first and second capacitors being charged through said first and second transistors respectively when said transistors are in the conducting state and discharged through said first and second capacitor discharge means respectively when said transistors are in the non-conducting state, so that current flows in the collectors of said first and second transistors during the charging of said first and second capacitors respectively, said current being dependent upon and thereby indicating the present values of said first and second capacitors.

8. The capacitance detection device of claim 7 wherein:

said first and second transistors are of the same voltage polarity so that said first and second transistors are always in the same said state, both being conducting or non-conducting at a given point in the cycle of the varying voltage, and an amplifier having said first and second outputs from said collectors of said first and second transistors as inputs, said amplifier comparing said first and second outputs and generating a third output dependent upon the difference in said first and second outputs, thereby indicating the difference between said capacitances of said first and second capacitors.

9. The capacitance detection device of claim 7 wherein:

said first and second transistors are of the opposite voltage polarity so that said first and second transistors are always in the opposite said states, one said transistor being conducting and one said transistor being non-conducting at a given point in the cycle of said varying voltage, said collector of said first transistor connected to said collector of said second transistor, thereby providing a single output dependent upon and thereby indicating the difference between said capacitances of said first and second capacitors.

* * * * *

UNITED STATES PATENT AND TRADEMARK OFFICE
CERTIFICATE OF CORRECTION

PATENT NO. : 4,142,144
DATED : February 27, 1979
INVENTOR(S) : BRUCE E. ROHR

It is certified that error appears in the above–identified patent and that said Letters Patent are hereby corrected as shown below:

Col. 2, line 25, "cicuit" should be --circuit--;
" 44, "detention" should be --detection--;
" 61, "of" should be --or--;
Col. 5, " 39, "transistor" should be --transistors--
" 6, " 61, "trnsistors" should be --transistors;
" 7, " 3, "colletors" should be --collectors--.

Signed and Sealed this

Twenty-ninth Day of May 1979

[SEAL]

Attest:

RUTH C. MASON
Attesting Officer

DONALD W. BANNER
Commissioner of Patents and Trademarks

UNITED STATES PATENT AND TRADEMARK OFFICE
CERTIFICATE OF CORRECTION

PATENT NO. : 4,142,144
DATED : February 27, 1979
INVENTOR(S) : BRUCE E. ROHR

It is certified that error appears in the above–identified patent and that said Letters Patent are hereby corrected as shown below:

Column 7, line 11, "claim 1" should be --claim 2--;

Column 7, line 25, "claim 1" should be --claim 2--.

Signed and Sealed this

Twenty-fifth Day of September 1979

[SEAL]

Attest:

LUTRELLE F. PARKER
*Attesting Officer*         *Acting Commissioner of Patents and Trademarks*